United States Patent [19]

Kaganowicz

[11] Patent Number: 4,616,597
[45] Date of Patent: Oct. 14, 1986

[54] APPARATUS FOR MAKING A PLASMA COATING

[75] Inventor: Grzegorz Kaganowicz, Belle Mead, N.J.

[73] Assignee: RCA Corporation, Princeton, N.J.

[21] Appl. No.: 666,838

[22] Filed: Oct. 31, 1984

[51] Int. Cl.$^4$ .......................................... H01L 21/316
[52] U.S. Cl. .................................. 118/723; 118/728; 118/50.1; 427/39
[58] Field of Search ...................... 118/723, 50.1, 728; 427/39

[56] References Cited

U.S. PATENT DOCUMENTS

| | | | |
|---|---|---|---|
| 4,223,048 | 9/1980 | Engle, Jr. .................. | 118/723 X |
| 4,329,219 | 5/1982 | Druzhinin et al. ............. | 427/126.5 |
| 4,339,471 | 7/1982 | Kaganowicz et al. ........... | 427/255.3 |
| 4,379,943 | 4/1983 | Yang et al. ................. | 427/39 X |
| 4,399,016 | 8/1983 | Tsukada et al. .............. | 118/723 X |
| 4,424,096 | 1/1984 | Kumagai .................... | 118/723 X |
| 4,514,192 | 4/1985 | Verma et al. ................ | 427/39 |

FOREIGN PATENT DOCUMENTS

| | | | |
|---|---|---|---|
| 57-37821 | 3/1982 | Japan ..................................... | 427/39 |
| 58-122736 | 7/1983 | Japan ..................................... | 427/39 |

*Primary Examiner*—John D. Smith
*Attorney, Agent, or Firm*—Birgit E. Morris; Theodore R. Furman

[57] ABSTRACT

An improved radio frequency (RF) glow discharge apparatus is disclosed for depositing dielectric films onto substrates in a continuous operation. The apparatus includes one or more capacitively coupled electrodes, with a plate of a dielectric material that overlies the surface of the electrode(s) coupled with the plasma. The thickness of the plate is sufficient such that during deposition with the apparatus of this invention, the amount of material deposited on the electrodes is negligible, and the potential between the electrodes and the substrate remains substantially the same. This, in turn, insures that the chemical structure and properties of the deposited films are reproducible over long periods of operation.

7 Claims, 2 Drawing Figures

APPARATUS FOR MAKING A PLASMA COATING

The present invention relates to an improved apparatus for reproducible deposition of thin films and more particularly is concerned with plasma deposition of dielectric films in a radio frequency (RF) glow discharge employing one or more capacitively coupled electrodes.

BACKGROUND OF THE INVENTION

As plasma deposition of thin films becomes an increasingly more viable process for commercial production, an understanding of those parameters which control the chemical structure and properties of the film assumes greater importance. A glow discharge system in its simplest form comprises a deposition chamber, means for evacuating the chamber, means for introducing gases into the chamber, a power source and means for efficient transfer of the power to the gases. Kaganowicz et al. show such a glow discharge system in U.S. Pat. No. 4,339,471. Glow discharge systems for commercial scale production typically include a deposition chamber wherein substrates are automatically conveyed under (or over) a series of "in-line" electrodes.

The chemical composition and properties of the deposited film are determined by the species generated in the plasma. These species in turn depend on the power applied to the electrodes and the potential between the electrodes and the substrate to be coated. Since the power supplies typically utilized in these systems have a constant power output it becomes necessary to optimize and maintain the size and spacing of the electrodes with respect to the substrate for a particular coating. In this way when a given potential is correlated to a desired film structure, reproducibility of that film is insured.

In practice, however, as much as a 30 percent drop in potential has been noted after several hours of operation which results in a change in the properties of the deposited film. It is believed the drop is caused by substantial deposition of material onto the electrodes. It is necessary then to shut down the system and remove the buildup of material on the electrodes.

It would be desirable to be able to deposit reproducible coatings by glow discharge in a production environment without having to interrupt the process every 2 to 3 hours.

SUMMARY OF THE INVENTION

An improved radio frequency (RF) glow discharge apparatus is disclosed for depositing dielectric films onto substrates in a continuous operation. The apparatus includes one or more capacitively coupled electrodes with a plate of a dielectric material that overlies the surface of the electrode(s) coupled with the plasma. The thickness of the plate is sufficient such that during deposition with the apparatus of this invention, the amount of material deposited on the electrodes is negligible, and the potential between the electrodes and the substrate remains substantially the same. This, in turn, insures that the chemical structure and properties of the deposited films are reproducible over long periods of operation.

DETAILED DESCRIPTION OF THE INVENTION

Figure 1:
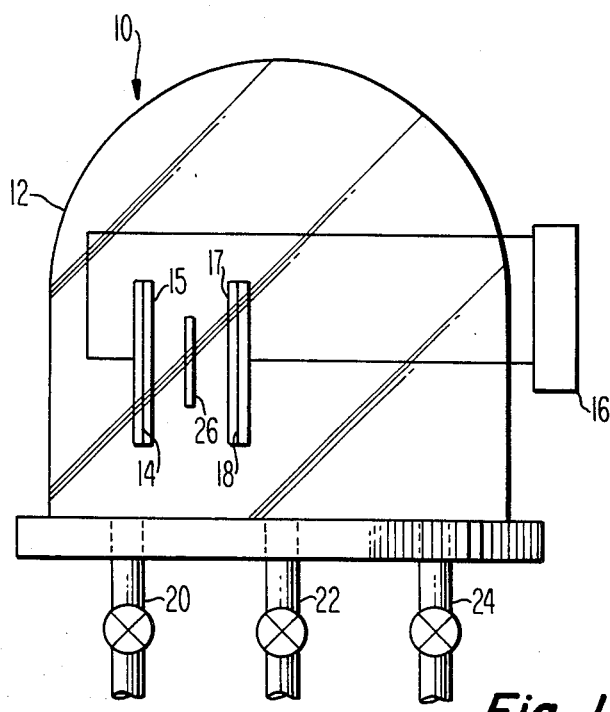
FIG. 1 illustrates a glow discharge apparatus of the present invention.

The apparatus of the present invention stabilizes the dielectric properties of the space between an electrode and a substrate in an RF glow discharge system. This is accomplished by placing a plate of dielectric material over the surface of the capacitive electrode which is coupled with the plasma.

It has been determined that during glow discharge deposition, the deposition of material on the electrodes tends to change the dielectric properties of, and thereby the potential across, the space between the electrode and the substrate. The thickness of the plate should be sufficient to render negligible any deposition of material on the electrode. It has been found that if the plate is at least about 50 times thicker than the anticipated deposit of material on the electrode, there is no drop in potential. Without the dielectric plate, it would be necessary to periodically cease operation every few hours and clean the coated electrodes in order to maintain uniform chemical structure and properties of the deposited films.

While maintaining the plate at least 50 times thicker than the deposit on the electrodes stabilizes the dielectric properties of the space between electrode and substrate for a single deposition, from a production perspective, it is advantageous to be able to operate a glow discharge system with a stabilized potential until the system would normally be shut down for cleaning. A preferred embodiment of the present invention provides this result by incorporating into the glow discharge apparatus a plate of dielectric material whose thickness is at least about 50 times greater than the maximum tolerable buildup level for that system. In this way the plate is at all times a minimum of 50 times thicker than the competing deposition on the electrode thereby maintaining stability of composition and properties of the deposited films until the apparatus would otherwise have to be cleaned. As a practical matter the dielectric plate thickness is limited on the upper extreme by the physical specifications of the particular deposition system.

Another consideration is the material of the dielectric plate. In practice any dielectric material, otherwise compatible with the apparatus, is suitable. However, because many of the dielectric materials suitable would tend to sputter, especially at high power levels, contamination of the deposited film may result. Therefore, the material used for the plate should preferably be of the same chemical structure and properties of the film of material to be deposited. In this way, any secondary deposition onto the substrate by sputtering will not compromise the integrity of the deposited film.

The present apparatus will now be described with reference to the Drawing. Further, the invention will be described with reference to the deposition of silicon dioxide ($SiO_2$) onto a substrate.

In FIG. 1 is shown an embodiment of the improved apparatus suitable for use in the present invention generally as 10. The glow discharge apparatus 10 includes a vacuum chamber 12 which can be a glass bell jar. In the vacuum chamber 12 are two electrodes 14, 18 which can be a screen, coil or plate of a material that is a good electrical conductor and does not readily sputter, such as aluminum. Affixed to the surfaces of the electrodes 14 and 18, which will face the plasma, are two 0.125 inch (31.75 cm) thick silicon dioxide (SiO$_2$) plates 15, 17. The thickness of the plates 15, 17 has been chosen to be about 50 times greater than the maximum tolerable thickness of SiO$_2$ buildup in this apparatus 10. By maintaining a minimum 50:1 ratio of the plates 15, 17 to any coating deposited thereon, the potential drop as a result of such coating will be negligible. A radio frequency, constant ouput power supply 16, is employed to obtain a voltage potential between the electrodes 14, 18. An outlet 20 into the vacuum chamber 12 allows for evacuation of the system and is connected to a mechanical pump, not shown. A first inlet 22 and a second inlet 24 are connected to gas bleed systems, not shown, for adding the reactants employed to prepare the SiO$_2$ coating.

In carrying out the process a substrate 26 to be coated is placed between, and spaced apart from, the electrodes 14, 18, typically maintained about 5 to 10 centimeters apart. The vacuum chamber 12 is then evacuated through the outlet 20 to a pressure of about $0.5-1\times10^{-5}$ torr. Nitrous oxide (N$_2$O) is added through the first inlet 22 to its desired partial pressure and silane (SiH$_4$) is added through the second inlet 24 until the desired partial pressure ratio of silane (SiH$_4$) to nitrous oxide (N$_2$O) is obtained, for example, about 1 to 6.

In order to begin deposition of the silicon dioxide (SiO$_2$) coating on the substrate 26, a glow discharge is initiated between the electrodes 14 and 18 by energizing the power source 16. For deposition the power should be in the range of 0.05 to 5 watts/cm$^2$ of electrode, preferably 0.1 to 1 watts/cm$^2$ of electrode, and should be at a radio frequency. The potential between electrodes 14 and 18 is generally about 1,000 volts.

Figure 2:
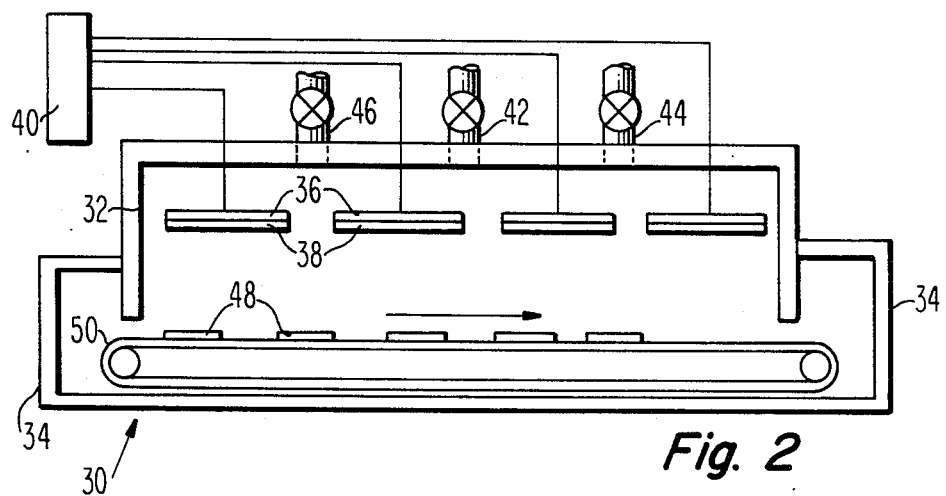
FIG. 2 illustrates an alternate embodiment of a glow discharge apparatus of the present invention.

In FIG. 2 is shown another embodiment of the present apparatus suitable for mass production, an "in-line" coater, generally as 30. Analogous in many respects to the apparatus 10 of FIG. 1, this "in-line" coater 30 comprises a deposition chamber 32 with load/unload chambers 34 on either end. A series of in-line electrodes 36 with dielectric plates 38 affixed thereto are connected to a power supply 40. An outlet means 42 is connected to an evacuation means (not shown). Inlets 44 and 46 allow introduction of plasma precursors into the chamber 32.

The deposition process is carried out substantially as described hereinabove, but with the substrates 48 to be coated being conveyed across the plasma area, i.e. between the electrodes 36 and substrates 48, by the conveyor means 50 which is spaced apart from the electrodes 36.

While the apparatus of the invention has been described with respect to the deposition of silicon dioxide (SiO$_2$), it should be appreciated that deposition of other dielectrics, such as silicon oxide, silicon oxynitride, silicon nitride, etc., as well as semiconductors with other RF, capacitively coupled glow discharge systems would fall within the scope of the invention.

I claim:

1. In a radio frequency (RF) glow discharge apparatus for deposition of a film of a first material on a substrate, said apparatus having a capacitively coupled electrode, spaced apart from said substrate, which electrode is capable of transferring the power from an RF power source to a gas plasma within said apparatus, the improvement comprising;

a plate of a second material affixed to that surface of the electrode which is coupled with the plasma, being of sufficient thickness to render negligible any changes in the potential between the electrode and the substrate to be coated caused by deposition onto said electrode.

2. The apparatus of claim 1 wherein the plate of the second material comprises a dielectric material.

3. The apparatus of claim 2 wherein the plate of dielectric material is at least about 50 times thicker than the thickness of coating of the first material to be deposited onto said substrate.

4. The apparatus of claim 2 wherein the plate of dielectric material is at least about 50 times greater than the maximum thickness of deposit tolerable on the inside of said apparatus.

5. The apparatus of claim 2 wherein the plate of dielectric material is comprised of the same material and composition as the first material.

6. The apparatus of claim 2 wherein the dielectric material is selected from the group consisting essentially of silicon monoxide, silicon dioxide, silicon oxynitride, and silicon nitride.

7. The apparatus of claim 2 wherein the plate of dielectric material is silicon dioxide.

* * * * *